United States Patent [19]

Kamiya et al.

[11] Patent Number: 4,613,830
[45] Date of Patent: Sep. 23, 1986

[54] PROXIMITY SWITCH HAVING VARIABLE GAIN OSCILLATOR

[75] Inventors: Fumio Kamiya, Nagaokakyo; Hisatoshi Nodera, Kusatsu; Kenji Ueda, Otsu; Keinosuke Imazu, Takatsuki; Hidehiro Tomioka, Kyoto, all of Japan

[73] Assignee: Omron Tateisi Electronics, Co., Kyoto, Japan

[21] Appl. No.: 759,981

[22] Filed: Jul. 29, 1985

[30] Foreign Application Priority Data

Jul. 27, 1984 [JP] Japan .................................. 59-157915
Jul. 27, 1984 [JP] Japan .................................. 59-157916

[51] Int. Cl.⁴ ........................... G01V 3/11; H03B 5/12
[52] U.S. Cl. ..................................... 331/65; 324/207; 324/236; 324/327; 331/109; 331/117 R; 331/183
[58] Field of Search .................. 331/65, 117 R, 109, 331/167, 168, 183; 324/327, 222, 236, 207, 208, 237; 340/941, 551, 552, 561

[56] References Cited

U.S. PATENT DOCUMENTS

4,204,160 5/1980 Voll .................................. 331/65 X
4,543,527 9/1985 Schuchmann et al. .......... 331/167 X Primary Examiner—Siegfried H. Grimm
Attorney, Agent, or Firm—Wegner & Bretschneider

[57] ABSTRACT

Disclosed is a proximity switch which includes an oscillation circuit whose oscillation output is variable depending on the inductance of a coil so that an object in proximity may be detected from the decline in the oscillation output. Further, the oscillation gain of this oscillation circuit is variable according to an input from an external source. Thus, for the purpose of increasing the recovery speed of the oscillation which has dropped as a result of detecting an approaching object, comparison circuits are provided so that upon reduction in the oscillation output of the oscillation circuit a certain signal is applied to the oscillation circuit to increase its oscillation gain. As a result, even when an object in proximity is detected and the oscillation level is maintained at a certain low level so that the oscillation may be resumed quickly when the object has moved away from the proximity switch. By virtue of the increased response speed of the proximity switch, not only its detection capability is improved but also it is usable in an environment where a strong AC magnetic field is present.

7 Claims, 7 Drawing Figures

(a) Output of oscillation circuit 1

(b) Output of comparison circuit 24

(c) Output of comparison circuit 21

PROXIMITY SWITCH HAVING VARIABLE GAIN OSCILLATOR

TECHNICAL FIELD

This invention relates to a proximity switch of high frequency oscillation type with an improved response speed in detecting an object.

BACKGROUND OF THE INVENTION

A proximity switch of high frequency oscillation type has a detection coil in its detection head and an oscillation circuit is formed therein using the detection coil as an oscillation coil, so as to detect an object from the decline in the oscillation output. According to this oscillation circuit, the speed of termination of the oscillation may be varied by adjusting the shape and winding of the detection coil L and changing other circuit constants. However, when an object approaches the detection coil and increases the conductance of the detection coil, the oscillation is terminated sooner or later. Therefore, the response speed of a proximity switch may be considered as the total time of the start and the termination of oscillation.

Generally speaking, oscillation of an oscillation circuit is extremely slow in rise (start) speed but is relatively fast in termination speed. The time tau required for oscillation to start, grow and reach a level which enables the detection of an object may be given as follows:

$$\text{tau} = \frac{2c}{g} \ln \frac{V_o}{V_s} \quad (1)$$

where
- $V_o$: Output reversion level
- $V_s$: Amplitude level at the beginning of oscillation
- C: Capacitance of the resonance capacitor
- g: Variation of conductance from the beginning of oscillation.

Generally, the amplitude level at the termination of oscillation is a noise level which is, for instance, in the order of mV's. As the detection distance is increased, the conductance variation decreases and the response speed decreases, causing the problem that the detection of a fast moving object becomes impossible. To avoid such a problem, a proposal has been made to provide a initialization signal generator for giving an initialization signal to the oscillator circuit (Japanese Patent Laying-Open Publication No. 58-1327), but the initialization signal must be matched to the oscillation frequency and the circuitry tends to be complicated.

Furthermore, in an environment where a strong AC magnetic current is present as in a resistance welder which involves an electric current of more than ten thousand A, the ferrite core of the detector coil is magnetically saturated and, due to the increase in the loss in the detection coil, the oscillation is interrupted. Therefore, in such an environment, a conventional proximity switch of high frequency oscillation type may become unusable

SUMMARY OF THE INVENTION

In view of such problems of conventional proximity switches, a primary object of this invention is to provide a proximity switch which has a high response speed through speed up in the start of the oscillation of an oscillation circuit A second object of this invention is to provide a proximity switch which is capable of withstanding a strong magnetic field so that it may be used in an environment where a strong AC magnetic field is present.

According to a certain aspect of this invention, there is provided a proximity switch of high frequency oscillation type having an oscillation circuit and a detector circuit which detects an object from reduction in oscillation output, characterized in that: the oscillation circuit is an oscillation circuit which increases its oscillation gain according to an output from an external source; the proximity switch further comprising: a first rectifying circuit which rectifies the output of the oscillation circuit and smoothes the output according to a certain time constant; a second rectifying circuit which rectifies the output of the oscillation circuit and smoothes the output according to a time constant smaller than the mentioned time constant to give an oscillation gain control signal to the oscillation circuit; and a comparison circuit which detects the reduction in the output of the first rectifying circuit by comparing the output thereof with a certain reference level and produces an object detection signal; whereby the oscillation circuit being capable of increasing its gain according to the reduction in the oscillation gain.

According to this aspect of the present invention which is thus characterized, the output of the oscillation circuit is divided between two circuit blocks for signal detection and gain adjustment when the oscillation level has declined to a certain level and, by providing a separate rectifying circuit to each of these circuit blocks, an object detection signal is obtained at different discharge time constants at the same time as adjusting the gains. Therefore, by reducing the time constants for gain adjustment, it becomes possible to perform the gain adjustment in a brisk manner according to the changes in oscillation amplitude.

Furthermore, because the discharge time constants for the output of the object detection signal may be selected according to the requirements arising from the environment of the proximity switch, such as the capabilities to withstand noises and magnetic field, this invention can provide a proximity switch which is easy to use.

According to another aspect of this invention, there is provided a proximity switch of the abovementioned type, characterized in that: the oscillation circuit is an oscillation circuit which increases its oscillation gain according to an output from an external source; the proximity switch further comprising: a first comparison circuit for comparing the oscillation amplitude level of the oscillation circuit with a first reference value and producing an object detection signal; a second comparison circuit for comparing the oscillation amplitude level of the oscillation circuit with a second reference value and supplying a gain amplification signal to the oscillation circuit; and a reference power source, consisting of serially connected resistors, which gives a high voltage end of the serially connected resistors to the first comparison circuit as a reference signal and a low voltage end to the second comparison circuit as a reference signal.

According to this aspect of the present invention which is thus characterized, upon decrease in the output of the oscillation circuit, the first comparison circuit produces an object detection signal and upon further decrease in the output of the oscillation circuit the second comparison circuit supplies a gain amplification signal to the oscillation circuit. And, by use of a voltage division with resistors, the first comparison circuit receives a reference voltage which is higher than that of the second comparison circuit. Therefore, even if variations in the values of the internal resistances and temperature drifts are present, it is assured that the reference value level of the second comparison circuit is always lower than that of the first comparison circuit, whereby it is possible to avoid any chattering in the output and the oscillation may be maintained at a low level without fail.

Thus, by virtue of maintaining the oscillation at a low level, the resumption of the oscillation is brisk and a proximity switch of high response may be provided. Furthermore, because the speed of starting the oscillation is high, even in an environment where a strong AC magnetic field is present, the oscillation may be intermittently resumed at zero cross points. Therefore, by increasing the discharge time constant of the smoothing circuit for producing the object detection signal, it is possible to provide a proximity switch that can detect an object in a strong magnetic field.

BRIEF DESCRIPTION OF THE DRAWINGS

The present invention will now be shown and described in the following in terms of concrete embodiments thereof with reference to the appended drawings, in which.

DESCRIPTION OF THE PREFERRED EMBODIMENTS

Figure 1:
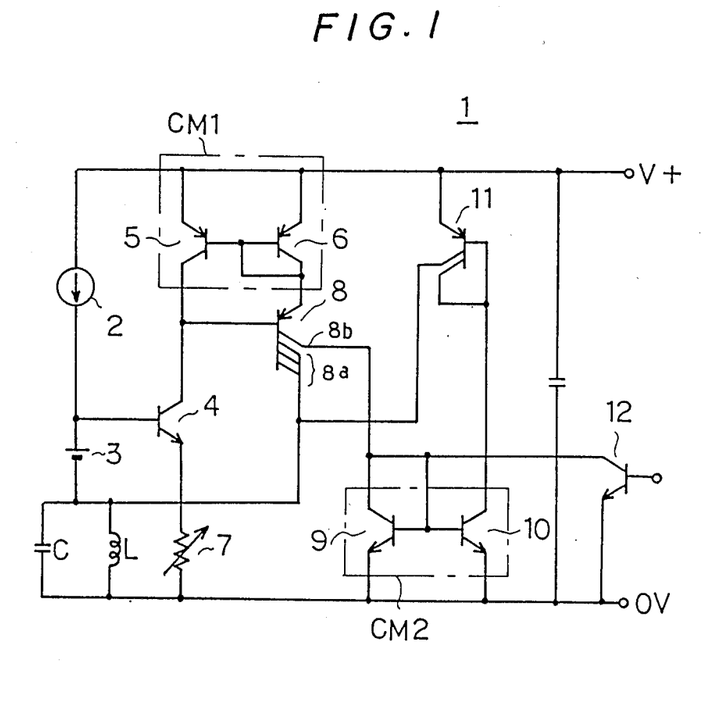
FIG. 1 is a circuit diagram of an embodiment of the oscillation circuit for the proximity switch according to this invention.

FIG. 1 is a circuit diagram of an embodiment of a proximity switch oscillation circuit according to this invention. According to this oscillation circuit, even after the oscillation output has declined as an object approaches the proximity switch and this decline in the oscillation output is detected by the proximity switch, the oscillation is maintained at a very small amplitude.

In the drawing, a resonance circuit is formed by a detection coil L provided in the front part of the proximity switch and a capacitor C connected in parallel thereto. And electric current is supplied to this LC resonance circuit from a constant current source 2 by way of a power source 3, and the common terminal is connected to the transistor 4 for current amplification. The collector of the transistor 4 is connected to a collector of a PNP transistor 5 which forms a current mirror circuit CM1 with another transistor 6. The emitter of the transistor 4 is grounded by way of a variable resistor 7 which determines the collector current. The collector of the transistor 6 is connected to the emitter of a transistor 8.

The transistor 8 is a multi-collector transistor having four collectors, and three of the collectors 8a are connected in common for feedback to the LC resonance circuit. The other collector 8b is connected to the collector-base common terminal of an NPN transistor 9. The transistor 9 forms a current mirror circuit CM2 in cooperation with another transistor 10. The emitter area of the transistor 9 is n-times greater than that of the transistor 10. And the collector of the transistor 10 is connected to the base-collector common terminal of a multi-collector transistor 11. The other collector of the multicollector transistor 11 is connected to the LC resonance circuit. Further, the base and the collector of the transistor 9 are connected to the collector of a transistor 12.

The transistor 12 is activated according to a signal given when the oscillation output has increased and controls the action of the current mirror circuit CM2.

Figure 2:
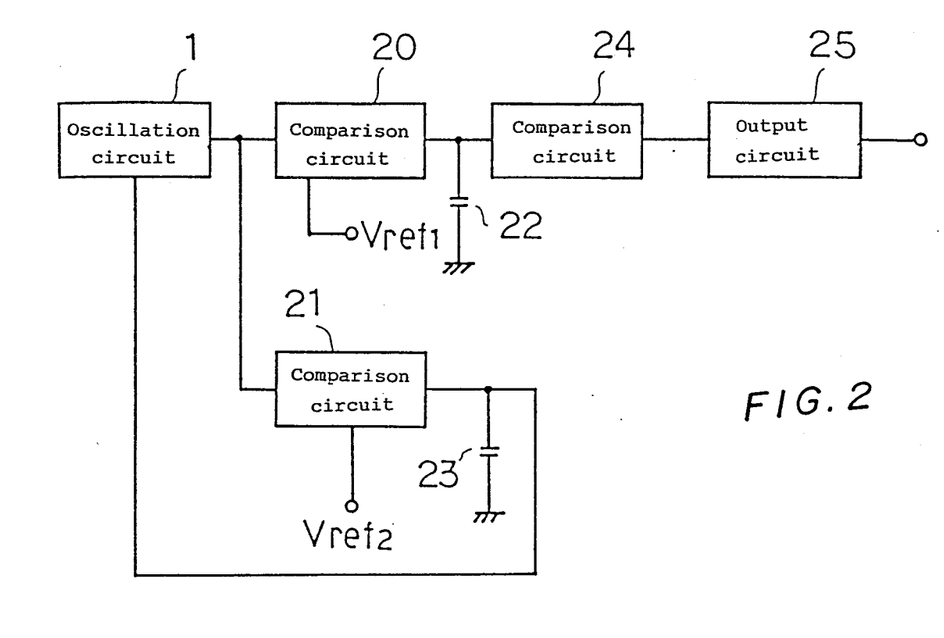
FIG. 2 is a block diagram showing an overall structure of the proximity switch according to this embodiment.

FIG. 2 is a block diagram showing the overall structure of the proximity switch according to this invention. In this drawing, the oscillation output of the oscillation circuit 1 shown in FIG. 1 is given to a pair of comparison circuits 20 and 21. The comparison circuits 20 and 21 are supplied with reference voltages Vref1 and Vref2, respectively, and convert the input signals into square wave signals. The output ends of the comparison circuits 20 and 21 are connected to smoothing capacitors 22 and 23, respectively, having different capacitances. Thus a pair of rectifying circuits are formed by the comparison circuit 20 and the capacitor 22, and the comparison circuit 21 and the capacitor 23, respectively, and convert signals of certain levels into DC levels.

The comparison circuit 20 detects the decline in the oscillation output and its output is supplied to a comparison circuit 24. The comparison signal given to the comparison circuit 24 is discriminated according to a certain threshold and is outputted from an output circuit as an object detection signal. On the other hand, the comparison circuit 21 compares the oscillation output with a certain level and its smoothing capacitor is so selected as to form a small time constant. And, the smoothed output end is supplied to the transistor 12 of the oscillation circuit 1.

Figure 6:
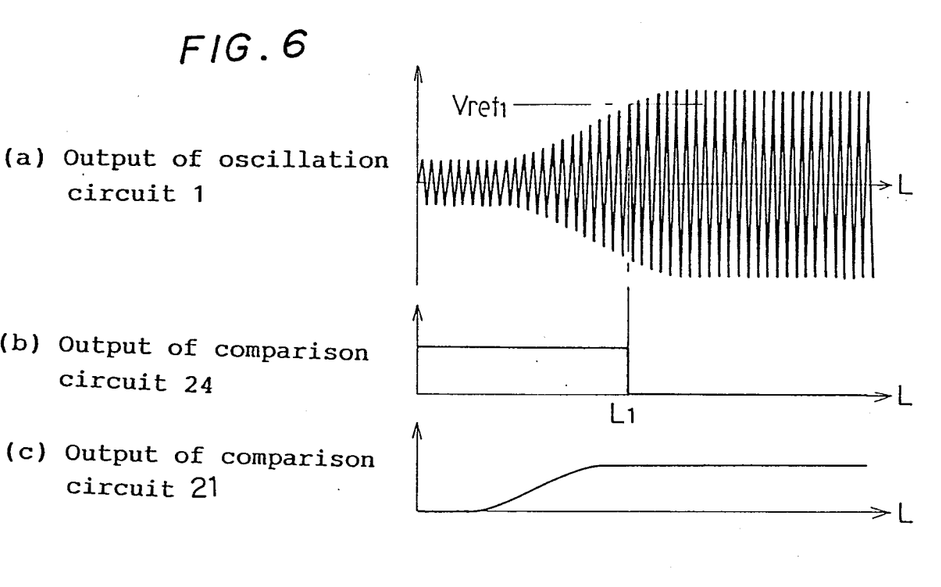
FIG. 6 is a wave form diagram for various parts of the embodiments shown in FIGS. 2 and 3 in relation with the distance between the proximity switch and an object to be detected.

Now the action of this embodiment is described in the following. FIG. 6 shows a diagram showing the wave forms of various parts in association with the distance between an approaching body and the detection coil of this embodiment. When the object is sufficiently far away, the coil L is without any substantial loss. In the oscillation circuit, the voltage of the LC resonance circuit is given to the transistor 4 for current amplification and collector current flows through the transistors 5 and 4. Due to this collector current, mirror current flows through the other transistor 6 and the mirror current is divided by the transistor 8. Therefore, approximately three quarters of the collector current of the transistor 6 current is fed back to the LC resonance circuit by way of the collector terminals 8a of the transistor 8.

And, when the object is far way and the oscillation level is high, an output is obtained from the comparison circuit 21 and the output is in turn smoothed by the smoothing capacitor 23 so that an oscillation gain control signal is supplied to the transistor 12 of the oscillation circuit 1 as shown in FIG. 6 (c). Therefore, the transistor 12 is turned on and the current mirror circuit CM2 is deactivated whereby the current feedback to the LC resonance circuit through the transistor 11 is interrupted. Therefore, the value of the current that is fed back to the LC resonance circuit is accounted for solely by the current of the collector 8a of the transistor 8.

As an object approaches the proximity switch, the oscillation output of the oscillation circuit 1 declines rapidly as shown in FIG. 6 (a). When the distance is L1 or when the output of the comparison circuit 20 goes below the reference voltage level Vref1 of the comparison circuit 24, the comparison circuit 20 ceases to send a signal to the comparison circuit 24. Therefore, the comparison circuit 24, detecting this, sends an object detection signal to the outside by way of the output circuit 25.

When the object comes closer to the proximity switch and the oscillation output declines even further, the output of the comparison circuit 21 also declines as shown in FIG. 6 (c) and the oscillation gain control signal supplied to the transistor 12 also declines. Therefore, the current mirror circuit CM2 gradually turns into an active state, and the collector current of the collector 8b of the transistor 8 flows into the current mirror circuit CM2 to drive the multi-collector transistor 11 by way of the current mirror CM2.

When the transistor 12 turns into a complete OFF state, then, because the emitter area of the transistor 10 is n-times greater than that of the transistor 9, the current of the collector 8b of the transistor 8 is current amplified by the current mirror circuit CM2. Thus, the other collector current of the multi-collector transistor 11 is fed back to the LC resonance circuit. Thereby, the gain of the oscillation circuit 1 is increased and the oscillation may be maintained at a low level even when the object approaches the proximity switch to an even closer range as shown in FIG. 6 (a).

Here, because the capacitance of the capacitor 23 connected to the output of the comparison circuit 21 is small or the time constant is small, the gain may be readily adjusted according to the changes in the oscillation amplitude. Moreover, the response speed for detecting an object may be varied by changing the capacitance of the capacitor 22 connected to the output of the comparison circuit 20. In other words, the oscillation start response speed tau is dependent on the initial amplitude as indicated in Equation (1) and the oscillation rise time may be drastically reduced by setting the initial amplitude level Vs at a high level. Therefore, as shown in FIG. 6 (a), the oscillation rise time may be reduced by maintaining the oscillation at a low level even after the object has come very close to the proximity switch and the object detection signal has been issued.

Therefore, in an environment where noise level is low, the response speed may be increased by reducing the capacitance of the capacitor 22 connected to the output end of the comparison circuit 20 or reducing the time constant of the smoothing circuit. If the noise resistance is required to be improved, the influences of noises may be eliminated by using a high value for the capacitance of the capacitor. This proximity switch may be used in an environment where a strong AC magnetic field is present as in the case of a resistance welder where electric current of great magnitude is used.

In this case, the oscillation can start near the zero cross points of the AC magnetic field and the oscillation can be started up in a brisk manner. For instance, when a AC magnetic field of 60 Hz is present, a series of burst wave forms of double the frequency of the magnetic field or 120 Hz can be obtained from the oscillation circuit 1. Therefore, by increasing the capacitance of the output capacitor 22 of the comparison circuit 20 to increase the time constant of the smoothing circuit and comparing the output with a certain threshold level in the comparison circuit 24, the presence of the burst oscillations may be detected and a proximity switch which is capable of withstanding a magnetic field may be obtained.

Figure 3:
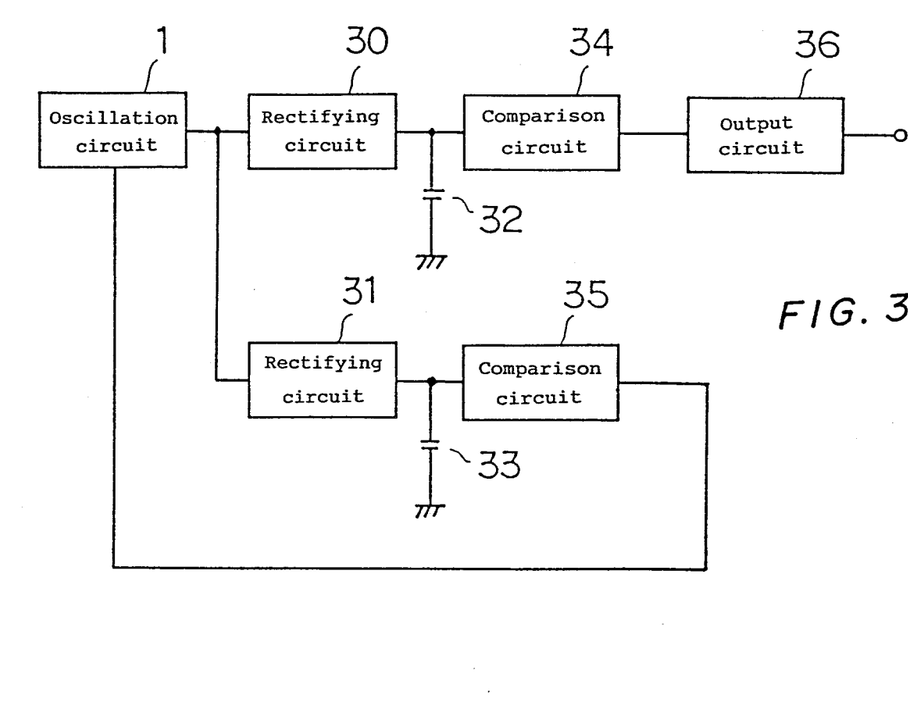
FIG. 3 is a block diagram showing the overall structure of another embodiment of the proximity circuit according to this embodiment.

FIG. 3 is a overall structural view of another embodiment of the proximity switch according to this invention. In this drawing, the output of the oscillation circuit 1 is given to a pair of rectifying circuits 30 and 31. The rectifying circuit 30 converts the oscillation output into a DC component as was the case with the comparison circuit 20, and its output end is connected to a capacitor 32 whose capacitance is selected according to the operating environment of the proximity switch. The output of the rectifying circuit 30 is supplied to the comparison circuit 34 and is outputted, by way of a switching circuit 36, as an object detection signal.

The rectifying circuit 31 converts the oscillation output into a DC component and its output end is connected to a smoothing capacitor 33, similar to the capacitor 23, of a small capacitance for a small time constant which is similar to the capacitor 23. The output signal is then converted into a square wave signal by a comparison circuit 35 which has a reference voltage based on a small amplitude of the oscillation and the transistor 12 of the oscillation circuit 1 is activated according to the decline in the oscillation output. In this embodiment, the oscillation gain adjustment signal is comprised of a two-value signal and the amplitude of the oscillation circuit 1 is controlled by intermittently activating the transistor 12.

Figure 4:
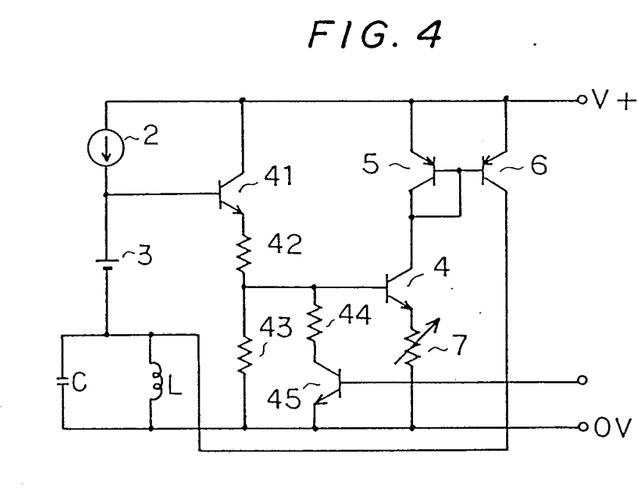
FIG. 4 is a circuit diagram showing another embodiment of the oscillation circuit of the proximity switch according to this invention.

FIG. 4 is a circuit diagram showing a second embodiment of the proximity switch oscillation circuit according to this invention. In this embodiment, those parts corresponding to the parts of FIG. 1 are denoted with like numerals.

In this embodiment, an emitter follower circuit is formed before a current amplification transistor and the feedback current is made variable by changing an emitter resistor for current feedback. In other words, an end of a power source is connected to the base of a transistor 41 which is connected as in an emitter follower and the collector of this transistor 41 is connected to the power source while its emitter is grounded by way of a pair of resistors 42, 43 which are connected in series. A serial connection of a resistor 44 and a switching transistor 45 is connected in parallel to the resistor 43. The common terminal is connected to the base of the current amplification transistor 4 and the collector of this transistor 4 is connected to a current mirror circuit consisting of a pair of transistors 5 and 6. And, the output of the comparision circuit 21 or 35 shown in FIG. 2 or 3, as the case may be, is connected to the base of transistor 45.

In this oscillation circuit, when the oscillation amplitude is great, the transistor 45 is in conductive state and the emitter resistance of the transistor 41 is a serial connection of the resistor 42 and a parallel connection of the resistors 43 and 44. However, when the oscillation amplitude has declined and the output from the comparison circuit 21 (35) has stopped, the transistor 45 is turned off and the resistor 43 is connected in series with the resistor 44, whereby the emitter voltage ratio of the transistor 41 may be raised and the current value of the current amplification transistor 41 may be increased.

Therefore, the feedback current given from the current mirror circuit formed by the transistors 5 and 6 increases and the oscillation may be maintained at a low level as was the case with the previously described embodiment.

Figure 5:
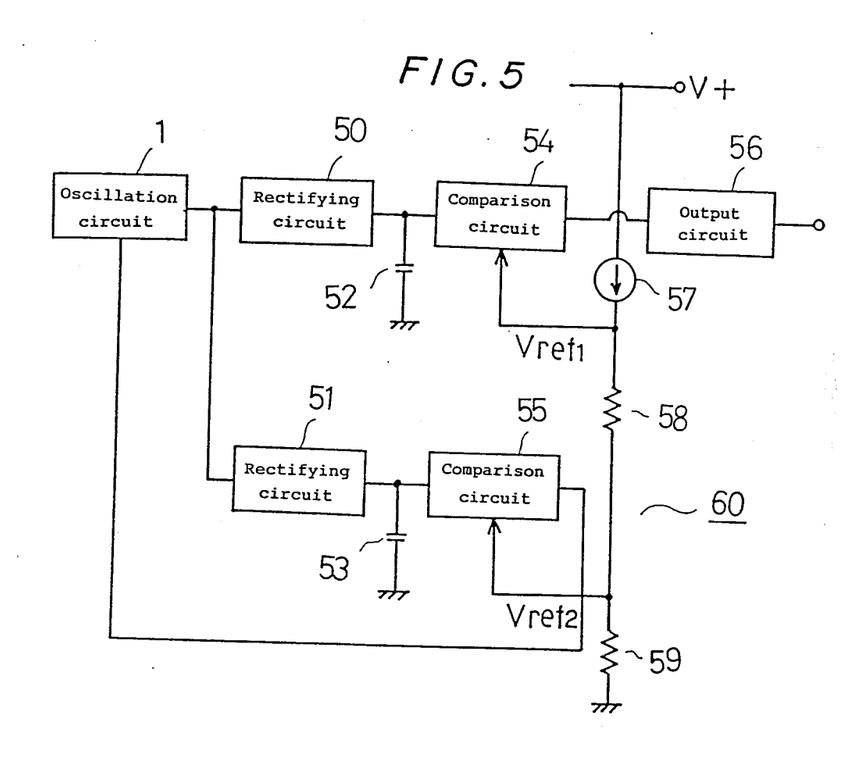
FIG. 5 is a block diagram showing an overall structure of yet another embodiment of the proximity switch according to this embodiment.

FIG. 5 is a block diagram showing the overall structure of yet another embodiment of the proximity switch according to this invention. In this drawing, the oscillation output of the oscillation circuit 1 shown in FIG. 1 is given to a pair of rectifying circuits 50 and 51. The rectifying circuits 50 and 51 convert the oscillation output into DC components according to their time constants, and their output ends are connected to smoothing capacitors 52 and 53, respectively, having different capacitances, and then to comparison circuits 54 and 55, respectively.

The comparison circuit 54 outputs a square wave signal when the oscillation output of the high frequency type proximity switch has dropped to a certain level and its output is supplied to the outside by way of an output circuit 56. The comparison circuit 55 compares the rectified output of the rectifying circuit with a reference level and increases the oscillation gain of the oscillation circuit 1.

And, as shown in FIG. 5, the comparison circuits 54 and 55 are connected to a pair of resistors 58 and 59 which are connected to a constant current source 57 in series, and a reference power source 60 is formed by the constant current source 57 and the resistors 58 and 59. Here, the high voltage ends of the resistors 58 and 59 are connected to the reference voltage inputs of the comparison circuits 54 and 55. The reference voltage levels Vref1 and Vref2 of the comparison circuits 54 and 55 are adjusted by setting up the resistive values of the resistors. Thus, it is possible to always give to the comparison circuit 54 a reference voltage which is higher than that of the comparison circuit 55.

Figure 7:
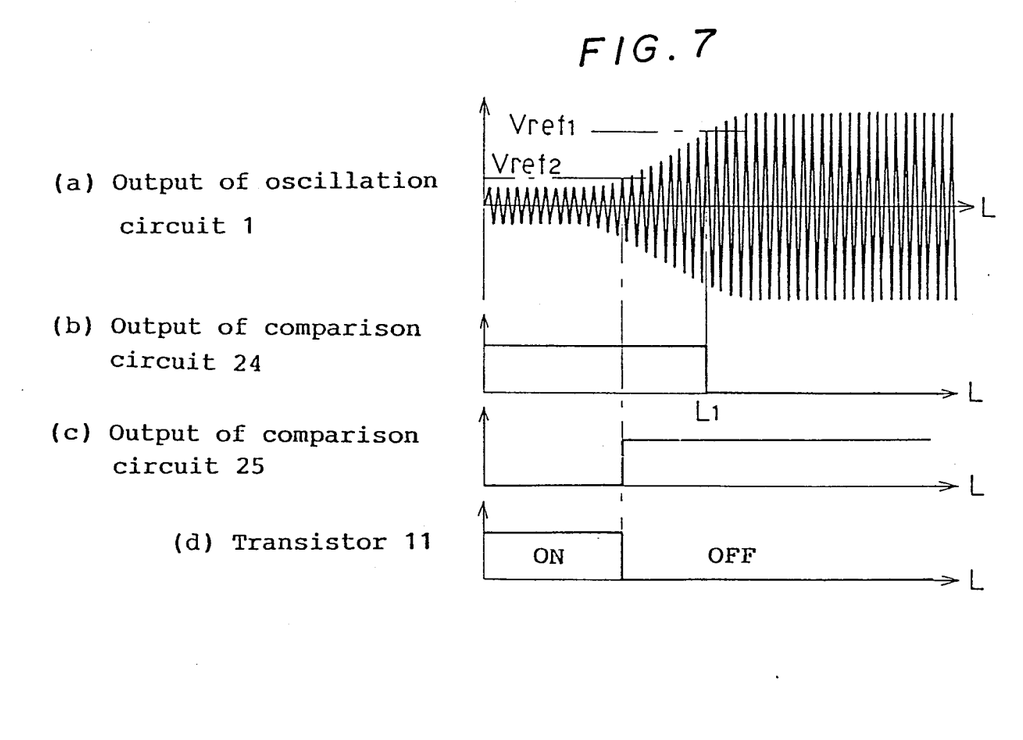
FIG. 7 is a wave form diagram for various parts of the embodiments shown in FIG. 5 in relation with the distance between the proximity switch and an object to be detected.

Now the action of this embodiment is described in the following with reference to FIG. 7. FIG. 7 shows a diagram showing the wave forms of various parts in association with the distance between an approaching body and the detection coil of this embodiment. When the object is sufficiently far away, the coil L is without any substantial loss. In the oscillation circuit, the voltage of the LC resonance circuit is given to the transistor 4 for current amplification and collector current flows through the transistors 5 and 4.

Due to this collector current, mirror current flows through the other transistor 6 and the mirror current is divided by the transistor 8. Therefore, approximately three quarters of the collector current of the transistor 6 is current fed back to the LC resonance circuit by way of the collector terminals 8a of the transistor 8. And, when the object is far way and the oscillation level is high, an output is obtained from the rectifying circuit 51 and the transistor 12 of the oscillation circuit is turned on by the output from the comparison circuit 55. Therefore, the current mirror circuit CM2 is deactivated whereby the current feedback to the LC resonance circuit through the transistor 11 is interrupted. Therefore, the value of the current that is fed back to the LC resonance circuit is accounted for solely by the collector current of the transistor 8.

As an object approaches the proximity switch, the oscillation output of the oscillation circuit 1 declines rapidly as shown in FIG. 7(a). When the distance is L1 or when the output of the rectifying circuit 50 has reached the reference voltage level Vref1 of the comparison circuit 54, the comparison circuit 54 turns into ON state and an object detection signal is produced from the output circuit 56.

When the object has come even closer to the proximity switch and the oscillation output declines even further, the output of the comparison circuit 55 turns into OFF state as shown in FIG. 7 (c) and the switching transistor 12 turns into OFF state. Therefore, the current mirror circuit CM2 formed by the transistors 9 and 10 turns into an active state, and the collector current of the collector 8b of the transistor 8 flows into the current mirror circuit CM2 to drive the multi-collector transistor 11 by way of the current mirror CM2, as shown in FIG. 7 (d). Because the emitter area of the transistor 10 is n-times greater than that of the transistor 9, the collector current of the transistor 8 is current amplified by the current mirror circuit CM2. Thus, the other collector current of the multi-collector transistor 11 is fed back to the LC resonance circuit. Thereby, the gain of the oscillation circuit 1 is increased and the oscillation may be maintained at a low level even when the object approaches the proximity switch to an even closer range as shown in FIG. 7 (a).

Here, the comparison circuits 54 and 55 are provided with the reference voltages Vref1 and vref2 by the reference power source comprising the resistors 58 and 59, and the reference voltage vref1 is always kept at a level which is higher than the reference voltage vref2 of the comparison circuit 55. As a result, chattering and instability due to reversion of the reference levels would not happen and stable action is always possible.

Although the present invention has been shown and described with reference to the preferred embodiment thereof, and in terms of the illustrative drawings, it should not be considered as limited thereby. Various possible modifications and alterations could be conceived of by one skilled in the art to any particular embodiment, without departing from the scope of the invention. Therefore it is desired that the scope of the present invention should be defined not by any of the perhaps purely fortuitous details of the shown preferred embodiment, or of the drawings, but solely by the scope of the appended claims, which follow.

What we claim is:

1. A proximity switch of high frequency oscillation type having an oscillation circuit and a detector circuit which detects an object from reduction in oscillation output, characterized in that:
   the oscillation circuit is an oscillation circuit which increases its oscillation gain according to an output from an external source;
   the proximity switch further comprising:
   a first rectifying circuit which rectifies the output of the oscillation circuit and smoothes the output according to a certain time constant;

a second rectifying circuit which rectifies the output of the oscillation circuit and smoothes the output according to a time constant smaller than the mentioned time constant to give an oscillation gain control signal to the oscillation circuit; and a comparison circuit which detects the reduction in the output of the first rectifying circuit by comparing the output thereof with a certain reference level and produces an object detection signal;

whereby the oscillation circuit being capable of increasing its gain according to the reduction in the oscillation gain.

2. A proximity switch as defined in claim 1, wherein the second rectifying circuit comprises a comparison circuit which produces an output when the output of the oscillation circuit has exceeded a certain level, and a capacitor for smoothing the comparison output.

3. A proximity switch as defined in claim 1, wherein the oscillation circuit comprises a switching device for controlling a feedback current, the oscillation circuit being a current feedback type oscillation circuit which changes its oscillation gain by varying the feedback current according to the output from the second rectifying circuit.

4. A proximity switch as defined in claim 1, wherein the oscillation circuit comprises a resistor voltage divider and is of a type which changes the oscillation gain according to the presence of the divided voltage.

5. A proximity switch of high frequency oscillation type having an oscillation circuit and a detector circuit which detects an object from reduction in oscillation output, characterized in that:

the oscillation circuit is an oscillation circuit which increases its oscillation gain according to an output from an external source;

the proximity switch further comprising:

a first comparison circuit for comparing the oscillation amplitude level of the oscillation circuit with a first reference value and producing and object detection signal;

a second comparison circuit for comparing the oscillation amplitude level of the oscillation circuit with a second reference value and supplying a gain amplification signal to the oscillation circuit; and a reference power source, consisting of serially connected resistors, which gives a high voltage end of the serially connected resistors to the first comparison circuit as a reference signal and a low voltage end to the second comparison circuit as a reference signal.

6. A proximity switch as defined in claim 5, wherein the oscillation circuit comprises a switching device for controlling the feedback current and is a current feedback type oscillation circuit which can vary its oscillation gain according to the changes in the feedback current according to an output from the second comparison circuit.

7. A proximity switch as defined in claim 1, wherein the oscillation circuit comprises a resistor voltage divider and is of a type which changes its oscillation gain according to the presence of the divided voltage.

* * * * *